US009729157B2

(12) United States Patent
Cops

(10) Patent No.: US 9,729,157 B2
(45) Date of Patent: Aug. 8, 2017

(54) VARIABLE CLOCK PHASE GENERATION METHOD AND SYSTEM

(71) Applicant: Mindspeed Technologies, Inc., Newport Beach, CA (US)

(72) Inventor: Wim F. Cops, Le Rouret (FR)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 14/622,706

(22) Filed: Feb. 13, 2015

(65) Prior Publication Data

US 2016/0241250 A1 Aug. 18, 2016

(51) Int. Cl.
*H03L 7/06* (2006.01)
*H03L 7/081* (2006.01)
*H03K 5/06* (2006.01)

(52) U.S. Cl.
CPC ............ *H03L 7/0814* (2013.01); *H03K 5/06* (2013.01); *H03L 7/0816* (2013.01)

(58) Field of Classification Search
None
See application file for complete search history.

(56) References Cited

U.S. PATENT DOCUMENTS

| 4,849,998 A | 7/1989 | Poklemba |
|---|---|---|
| 4,912,730 A | 3/1990 | Erhart |
| 5,194,828 A | 3/1993 | Kato et al. |
| 5,642,387 A | 6/1997 | Fukasawa |
| 5,691,527 A | 11/1997 | Hara et al. |
| 5,886,552 A | 3/1999 | Chai et al. |
| 5,960,042 A | 9/1999 | Chang et al. |
| 5,968,180 A | 10/1999 | Baco |
| 6,041,089 A | 3/2000 | Yokomizo |
| 6,064,707 A | 5/2000 | Woodman, Jr. |
| 6,108,794 A | 8/2000 | Erickson |
| 6,111,712 A | 8/2000 | Vishakhadatta et al. |
| 6,137,851 A | 10/2000 | Erickson et al. |
| 6,232,812 B1 | 5/2001 | Lee |
| 6,239,629 B1 | 5/2001 | Erickson |

(Continued)

OTHER PUBLICATIONS

Analog & Power, "An Introduction to clock distribution circuits", Alexander Pakosta, Texas Instruments, 2 pages, date unknown.

(Continued)

*Primary Examiner* — Cassandra Cox
(74) *Attorney, Agent, or Firm* — Weide & Miller, Ltd.

(57) ABSTRACT

A variable phase generator is disclosed that includes a delay line with an input, and output, and a delay lone control signal input. A signal on the delay line output has a phase offset relative to the delay line input signal such that the phase offset is controlled by a digital offset signal. A phase detector process the input signal and the output signal to generate a phase detector output signal. A charge pump, responsive to the phase detector output signal, generates a charge pump output. A digital to analog converter receives and converts the digital offset signal to an analog offset signal. A control node is connected to the delay line control input, the charge pump, and the digital to analog converter, and is configured to receive and combine the charge pump output and the analog offset signal to create the delay line control signal.

17 Claims, 6 Drawing Sheets

(56) References Cited

U.S. PATENT DOCUMENTS

| | | | |
|---|---|---|---|
| 6,269,136 B1 | 7/2001 | Hansen et al. | |
| 6,429,693 B1 | 8/2002 | Staszewski et al. | |
| 6,441,659 B1 * | 8/2002 | Demone | H03K 5/00006 |
| | | | 327/149 |
| 6,489,817 B1 | 12/2002 | Wong et al. | |
| 6,756,828 B2 | 6/2004 | Lee et al. | |
| 7,583,117 B2 * | 9/2009 | Lin | H03L 7/07 |
| | | | 327/149 |
| 7,978,012 B2 | 7/2011 | Woodman, Jr. | |
| 8,134,393 B1 * | 3/2012 | Nagaraj | H03L 7/083 |
| | | | 327/147 |
| 2001/0043172 A1 | 11/2001 | McGrath et al. | |
| 2005/0186918 A1 | 8/2005 | Ramet et al. | |
| 2006/0001494 A1 | 1/2006 | Garlepp et al. | |
| 2008/0111597 A1 | 5/2008 | Cranford et al. | |
| 2008/0265998 A1 | 10/2008 | Wood | |
| 2008/0290953 A1 | 11/2008 | Sandner et al. | |
| 2009/0141774 A1 | 6/2009 | Araki et al. | |
| 2009/0189656 A1 * | 7/2009 | Huang | H03L 7/0812 |
| | | | 327/158 |
| 2009/0244375 A1 | 10/2009 | Moehlmann et al. | |
| 2010/0074037 A1 * | 3/2010 | Lin | G11C 7/20 |
| | | | 365/194 |
| 2011/0032013 A1 | 2/2011 | Nelson et al. | |
| 2012/0038400 A1 | 2/2012 | Talaga, Jr. | |
| 2012/0139595 A1 * | 6/2012 | Kamath | H03L 7/0891 |
| | | | 327/158 |
| 2013/0271193 A1 * | 10/2013 | Keith | H03L 7/0812 |
| | | | 327/158 |

OTHER PUBLICATIONS

Texas Instruments, Application Report, "Using the CDCL6010 as a Frequency Synthesizer and Jitter Cleaner", Madhu Balasubramanian, SLLA259—Mar. 2007, Copyright © 2007, Texas Instruments Incorporated, 15 pages.

CDC7005, "3.3-V High Performance Clock Synthesizer and Jitter Cleaner", SCAS685J—Dec. 2002—Revised Jul. 2008, Copyright © 2008, Texas Instruments Incorporated, 33 pgs.

* cited by examiner

VARIABLE CLOCK PHASE GENERATION METHOD AND SYSTEM

BACKGROUND

1. Field of the Invention

This innovation relates to clock phase generation and in particular to variable clock phase generation over a wide range of frequencies.

2. Related Art

Numerous electronic and communication systems process received data signal or an internal data signal. As part of the processing of data, it is typical to lock or synchronize a local clock signal, or other type signal, to the data being processed. An important aspect to synchronizing to the data signal is locking local clock to the phase of the data signal. Because the frequency of the data signal may vary, or the system may be configured to operate as numerous different frequencies, it is important for a system to accurately adjust or lock to the phase of the data signal.

Numerous situations exist where locking a local clock is needed. For example, for data processing it may be necessary to lock a local clock to an incoming data signal, such as if the phase of the incoming data is not known. Some type of locking mechanism or system is needed to change or adjust the phase of the local clock to the data. Thus, the system must steer or modify the local clock phase to lock to the data.

In another example application, a system may be configured to monitor data to create an image of the data. The data may be part of a data stream or on chip. The data being sampled may have a phase which varies over time or may depend on the data itself. As a result, there is a need to adjust the phase to the local clock to insure accurate sampling timing and sampling frequency to create the image of the data. In such an embodiment, the phase may be swept to accurately sample the data and thus there is a need for an accurate and variable phase.

Prior systems and method would typically generate I & Q signals which are varied of modified by a ratio or percentage. Thus, by interpolating between I & Q signals, the phase can be swept such that the interpolation ratio determines the variable phase.

While this approach yields acceptable results for narrow frequency bands and lower application frequencies, it suffers from several drawbacks at higher frequencies and over wide frequency bands. For applications with over a broad range of frequencies, the prior art suffers from several drawbacks. For example, for applications which require operation at 28 GB/s data rates but also support data rates down to 2-3 Gb/s, the prior art is unable to accurately accommodate these frequency ranges. This a 10× range of data rates. For example the prior art phase blender circuitry, using ratio processing between the I & Q signals, becomes very complicated and accuracy suffers.

Thus, there is a need for a new, accurate, and reliable system and method to create a variable phase signal which may be applied over a wide range of frequencies and which operates at any data rate and is independent of data rate.

SUMMARY

To overcome the drawbacks of the prior art and provide additional benefits, a variable phase signal generator is disclosed. One example embodiment of the variable phase signal generator includes a delay line configured to receive a delay line input signal at a delay line input and output a delay line output signal at a delay line output, the delay line output signal having a phase offset relative to the delay line input signal such that the phase offset is controlled by a digital offset signal. The delay line also includes a delay line control input configured to receive a delay line control signal. A phase detector is configured to receive and process the input signal and the output signal to generate a phase detector output signal representing a phase difference between the input signal and the output signal. A charge pump is configured to receive the phase detector output signal and responsive to the phase detector output signal, generate and output a charge pump output. A digital to analog converter is configured to receive the digital offset signal and convert the digital offset signal to an analog offset signal. Also part of this embodiment is a control node connected to the delay line control input, the charge pump, and the digital to analog converter such that the control node is configured to receive and combine the charge pump output and the analog offset signal to create the delay line control signal.

In one embodiment the phase generator may further include an output capacitor connected to the control node such that the output capacitor is configured to limit a rate of change of the delay line control signal. The delay line input signal may be received from a local oscillator. The phase detector may comprise a comparator. In one arrangement, the phase detector is an analog signal that is proportional to the phase difference between the delay line input signal and the delay line output signal. It is contemplated that the charge pump may output a current that has a polarity that indicates the phase of the delay line output signal as related to the delay line input signal. The digital offset signal may vary over time.

Also disclosed is a signal generator comprising a variable phase generator configured to receive an input signal which has an input signal phase, at an input port, and output an output signal, which has an output signal phase, at an output port, the output signal having a phase that is variable, responsive to an offset signal. Also part of this embodiment is a control input configured to receive a control signal, the control signal controlling the phase of the output signal relative to the input signal. An offset signal source is configured to generate the offset signal. This offset signal source may be any source or device, such as a reference signal source or another element in the circuit or system. A comparator is provided and is configured to compare the input signal phase to the output signal phase to determine a phase difference, and responsive to the phase difference, generate and present an error signal to the variable phase generator to establish the output signal as having a predetermined phase offset in relation to the input signal. Also provided is a control node configured to receive and combine the offset signal and the error signal to create a feedback signal, and to present the feedback signal to the variable phase generator. The feedback signal is driving the phase difference between the input signal and the output signal to a combined phase offset that is controlled by the predetermined phase offset as established by the error signal and a phase offset establishing by the offset signal.

In one embodiment, the variable phase generator comprises a delay line. The signal generator may further include a control node, such that the comparator output and the offset signal are summed at the control node. In one configuration, the error signal is configured to introduce one clock period delay to the output signal in relation to the input signal and the offset signal is configured to introduce an amount of delay into the output signal, in relation to the input signal, that is proportional to the offset signal. The signal generator may further include a digital to analog converter configured to receive and process a digital offset signal to create the offset signal. The offset signal may be time varying.

Also disclosed is a method for creating a variable phase output signal. In one exemplary embodiment, this method includes receiving a reference signal having a reference signal phase. Responsive to a control signal on a control node, processing the reference signal with one or more delays to create a variable phase output signal having an output signal phase. The variable phase output signal thus has a phase offset from the reference signal that is variably determined by an offset signal. Then, comparing the reference signal phase to the output signal phase to create an error signal indicating the phase difference between the reference signal and the variable phase output signal. Responsive to the error signal, generating a feedback signal such that the feedback signal is provided to the control node. This method of operation also provides an offset signal to the control node. The offset signal defines the variable phase of the variable phase output signal. Then, at the control node, combining the error signal with the offset signal to create the control signal.

In one embodiment, the feedback signal is created by a charge pump responsive to the error signal. It is further contemplated that the offset signal is an analog signal. The method may further include maintaining signal stability at the control node with a capacitor connected between the control node and a ground node. In one embodiment, the step of comparing the reference signal phase to the output signal phase is performed by a phase detector. It is contemplated that the offset signal may vary over time to vary the phase of the variable phase output signal over time.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION OF EMBODIMENTS

To overcome the drawbacks of the prior art and to provide additional benefits, disclosed is a method and apparatus for generating a variable phase signal based on a user or system provided phase offset signal. The embodiment of FIG. 1 is but one possible exemplary embodiment and it is contemplated that one of ordinary skill may arrive at other embodiments which incorporate the novel features of the invention but do not depart from the scope of the claims.

Figure 1:
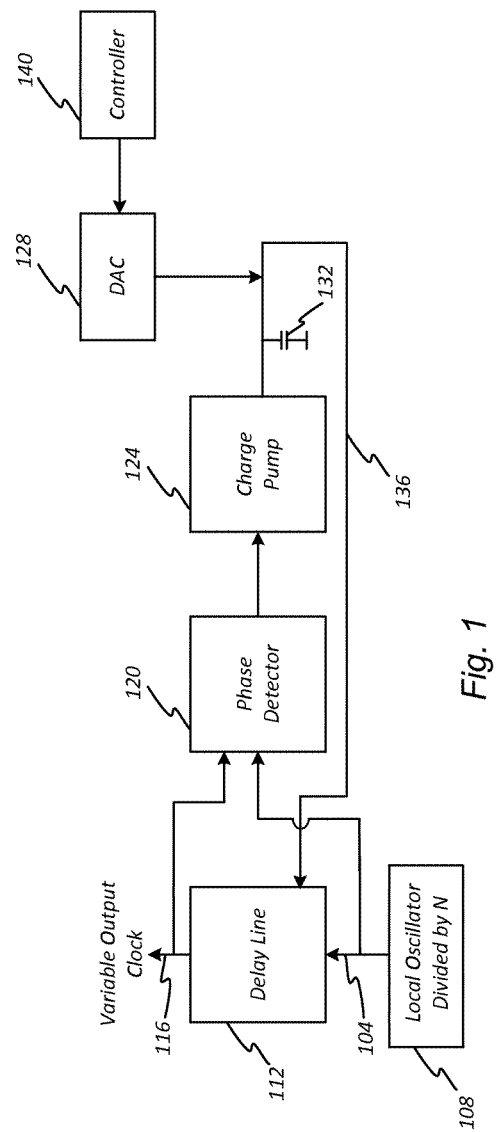
FIG. 1 is a block diagram illustrating an exemplary embodiment of a variable phase signal generator.

FIG. 1 is a block diagram illustrating an exemplary embodiment of a variable phase signal generator. In this embodiment, an input signal 104 is provided to a delay line 112. Depending on the implementation of the system of FIG. 1, the delay line 112 may be an analog delay line or a digital delay line. Delay lines are known in the art and as such, are not discussed in more detail that is provided below. The delay line 112 is a network of one or more electrical components connected in series, where each individual element creates a time difference or phase change between its input signal and its output signal. When implemented as an analog embodiment, the delay line 112 operates on analog signals whose amplitude may vary continuously. In one configuration, a series of RC networks can be cascaded to form a delay. A long transmission line can also provide a delay element. The delay time of an analog delay line may be only a few nanoseconds or several milliseconds, limited by the practical size of the physical medium used to delay the signal and the propagation speed of impulses in the medium. In a digital implementation, a digital delay line is a discrete element(s) which allows a signal to be delayed by a number of samples. The delay by one sample is notated $Z^{-1}$ and delays of N samples is notated as $Z^{-N}$ such that any number of sample delays may occur. A digital delay line may delay the signal by an integer number of samples or a non-integer delay, often referred to as fractional delay lines.

The output of the delay line 112 is presented as a variable output clock signal on output 116 and this variable output clock signal is also provided as an input to the phase detector 120. The variable output clock signal may be provided to any other system or device and provides the system with a highly accurate variable phase signal.

The input signal to the delay line 112 may be provided or created by a local oscillator 108 with a divide by N function. In other embodiments, the input to the delay line 112 may be provided by a crystal oscillator or any other signal source. The input signal is also provided to a phase detector 120 as shown. The phase detector 120 is discussed below in greater detail. The delay line establishes a delay line output 116 which comprises the desired variable output clock signal. The delay line output 116 also connects to the phase detector 120 as an input. As a result, the phase detector 120 receives both the input to the delay line 112 and the output from the delay line.

The phase detector 120 processes the phase detector inputs to determine a phase difference between the two signals. One of ordinary skill in the art is generally familiar with construction and operation of a phase detector 120 and as such, the phase detector is not discussed in detail herein.

A phase detector 120 or phase comparator is a frequency mixer, analog multiplier or logic circuit that generates a voltage signal which represents the difference in phase between two signal inputs. In this example embodiment, the phase detector 120 operates on connection with a charge pump (discussed below) that generates an output or a charge output amounts in proportion to the phase error detected between the two inputs. In one configuration, the phase detector produces both "up" and "down" control pulses even when the phase difference is zero, or no output if the phase is zero.

The output of the phase detector 120 represents the difference in phase between the two inputs to the phase detector, which is the difference between the input signal and the output signal. In one embodiment, the output of the phase detector comprises an analog signal such that a magnitude of phase detector output corresponds or is related the phase difference. Thus, a small phase difference between the two phase detector inputs yields a small magnitude phase detector output and as that phase difference increases the magnitude of the phase detector output would likewise increase. In other embodiments the phase detector may be a digital signal such that a difference in phase is represented by a high or low logic value. In addition, the polarity (positive/negative) of the phase detector 120 may be such that it represents whether the input is leading or lagging in phase as compared to the output (or whether the phase detector output is leading or lagging in phase as compared to the phase detector input). As discussed below, the leading or lagging nature of the phase may be used by subsequent processing elements.

The output of the phase detector 120 feeds into a charge pump. In one embodiment, a charge pump is a converter that uses capacitors as energy storage elements to create either a higher or lower voltage output responsive to the input signal from the phase detector. Charge pump circuits are capable of high efficiencies, sometimes as high as 90-95% while being highly accurate circuits. In this application, the charge pump 124 generates an output signal that increases or decreases responsive to the output of the phase detector 120. The charge pump acts as an integrator by injecting (or outputting) a current to the output capacitor 132.

In operation, the charge pump receives the phase detector output and responsive to the input, perform one of three actions. If the phase detector output is zero, indicating that the input and output of the delay line 112 are in phase, then the charge pump output is zero. If the input to the charge pump from the phase detector is negative the charge pump will pump or inject current into the capacitor 132 and node 136. If the input to the charge pump from the phase detector is positive the charge pump will pump down, or sink current from the capacitor 132 and from node 136. If the phase of the delay line output leads the delay line input, the output of the phase detector will be positive. If the phase of the delay line output lags the delay line input, the output of the phase detector will be negative. In other embodiment, lead and lagging phase may lead to different input and output polarity.

The output of the charge pump 124 connects to a control node 136. Also connected to the control node 136 is a capacitor 132. The control node 136 also receives an offset signal from a digital to analog converter (DAC) 128. The resulting signal on the control node 136 is provided as a control input to the delay line 112. The signal on the control node 136 thus controls the phase of the output signal on output 116 from the delay line 112 relative to the delay line input signal on delay line input 104. The delay line control signal is determined by or composed of three elements, the charge pump output, the offset signal from the DAC 128, and the charge stored on the capacitor 132. The capacitor 132 controls the rate of change of the delay line control signal on the control node 136. Because the capacitor 136 stores charge, it reduces the rates at which the charge pump 124 and the DAC 128 may change the charge on the control node 136. This improves stability and reduces overshoot and hunting by the delay line.

Responsive to the delay line control signal on the control node 136, the delay line 112 increases or decreases the phase of the signal presented to the delay line. The operation of the delay line 112 (absent the offset signal from the DAC 128) is such that the phase detector 120 and the charge pump will establish a one clock period delay in the delay line output relative to the delay line input. In other embodiments the delay could be 0.5 clock period or any other delay.

In this embodiment, the DAC 128 provides an analog offset signal to the control node 136. The value of the offset signal is set by an input from a controller 140. The controller 140 may be any device or element configure to provide a digital value to the DAC 128 that sets the offset signal, which is the phase offset in the output of the delay line. In one embodiment, the controller 140 includes a user interface where by a user sets the phase offset. In another embodiment the controller 140 comprises software (machine executable code) stored on a memory such that the software executes on a processor, ASIC, or DSP to control the phase offset. The phase offset may be fixed, swept, or arranged in any pattern or order as desired based on the input to the DAC from the controller.

Figure 2:
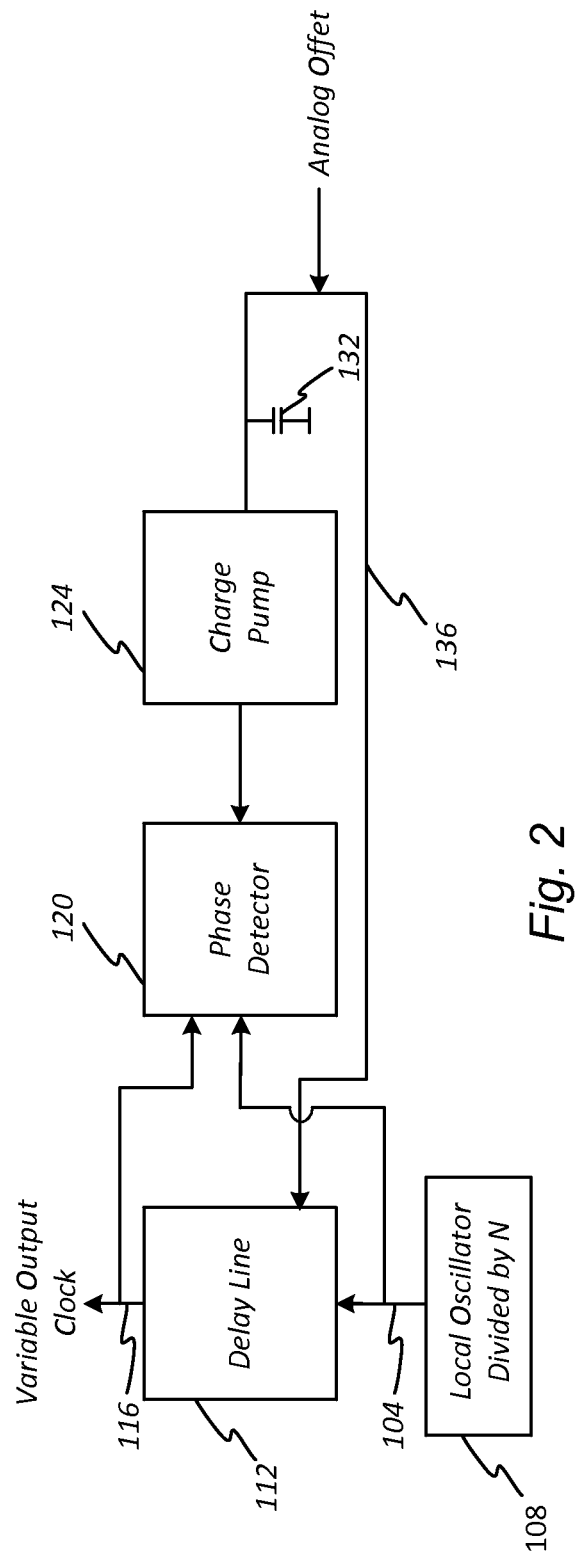
FIG. 2 is a block diagram illustrating an exemplary embodiment of a variable phase signal generator.

In another embodiment, as shown in FIG. 2, the system is configured without a digital to analog converter. As shown in FIG. 2, an analog input is provided directly to node 136. This arrangement avoids the use of the DAC 128 and instead provides an analog offset signal directly to the control node 136. The analog offset signal may be provided from other systems or elements such as but not limited to, a user interface, memory, external source, internal reference, or any other system of the electronic device. In another embodiment, not shown in a figure, the elements of FIG. 1 and FIG. 2 are combined such that the offset signal provided to the control node 136 is from both a direct analog input as shown in FIG. 2 and a digital signal converted to an analog embodiment as shown in FIG. 1.

Figure 3:
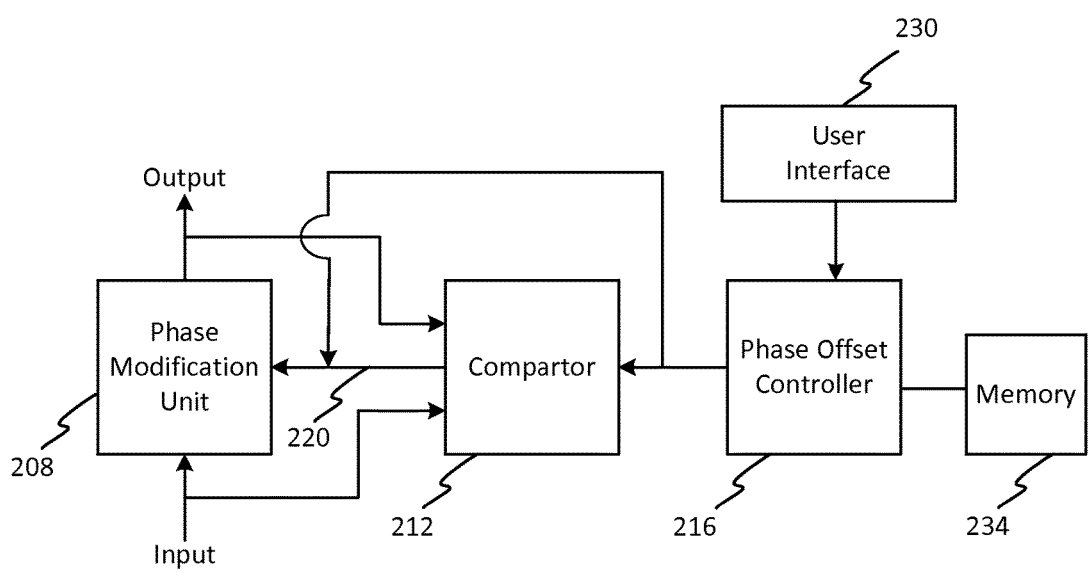
FIG. 3 is a simplified diagram illustrating an exemplary embodiment of a variable phase signal generator.

FIG. 3 illustrates a simplified block of a phase modification device. In this example embodiment, certain circuit elements are omitted to aid in understanding. As shown, a phase modification unit 208 receives an input signal. The input signal may be any type signal for which phase modification is to occur. The phase modification unit 208 is configured to modify the phase of the input signal to create an output signal with a modified phase. The phase modification unit 208 adjusts the phase of the output relative to the input, based on the input from the comparator. The phase of the output signal may be made to lead or lag the input signal phase.

The comparator 212 receives as inputs the input signal and the output signal and then compares the phase of the two signals. Based on the phase difference determined by the comparator 212, the comparator returns a first control signal to a control node 220. The comparator may be established with a zero phase offset, or any other phase offset up to one clock period.

Also connected to the control node 220 is a phase modification unit 208 which outputs an offset signal. This second control signal, provided to the control node 220 is combined with the first control signal to establish an offset signal on the control node 220. The offset signal is provided to the phase modification unit 208 as shown to modify the phase of the output signal in relation to the input signal.

In an alternative embodiment, the comparator 212 may receive an input from a phase offset controller 216. In this embodiment, the phase offset controller 216 sets the phase offset established by the comparator 212. For example, if the comparator 212 is set to zero phase offset, then the phase offset controller 216 may inject a request for phase offset to the comparator to thus establish the output signal as offset in phase from the input signal by that phase amount. It is contemplated that this offset may be fixed, or sweep over the range of all phase offsets over a clock period. The resolution of this phase sweep may be adjusted to any resolution, such as four phase step, 8 phase steps, 64 phase steps, or 360 phase steps. The control node 220 or the phase offset controller 216 may receive an input, such as a user input or a signal from another system, to control the phase offset.

Figure 4A:
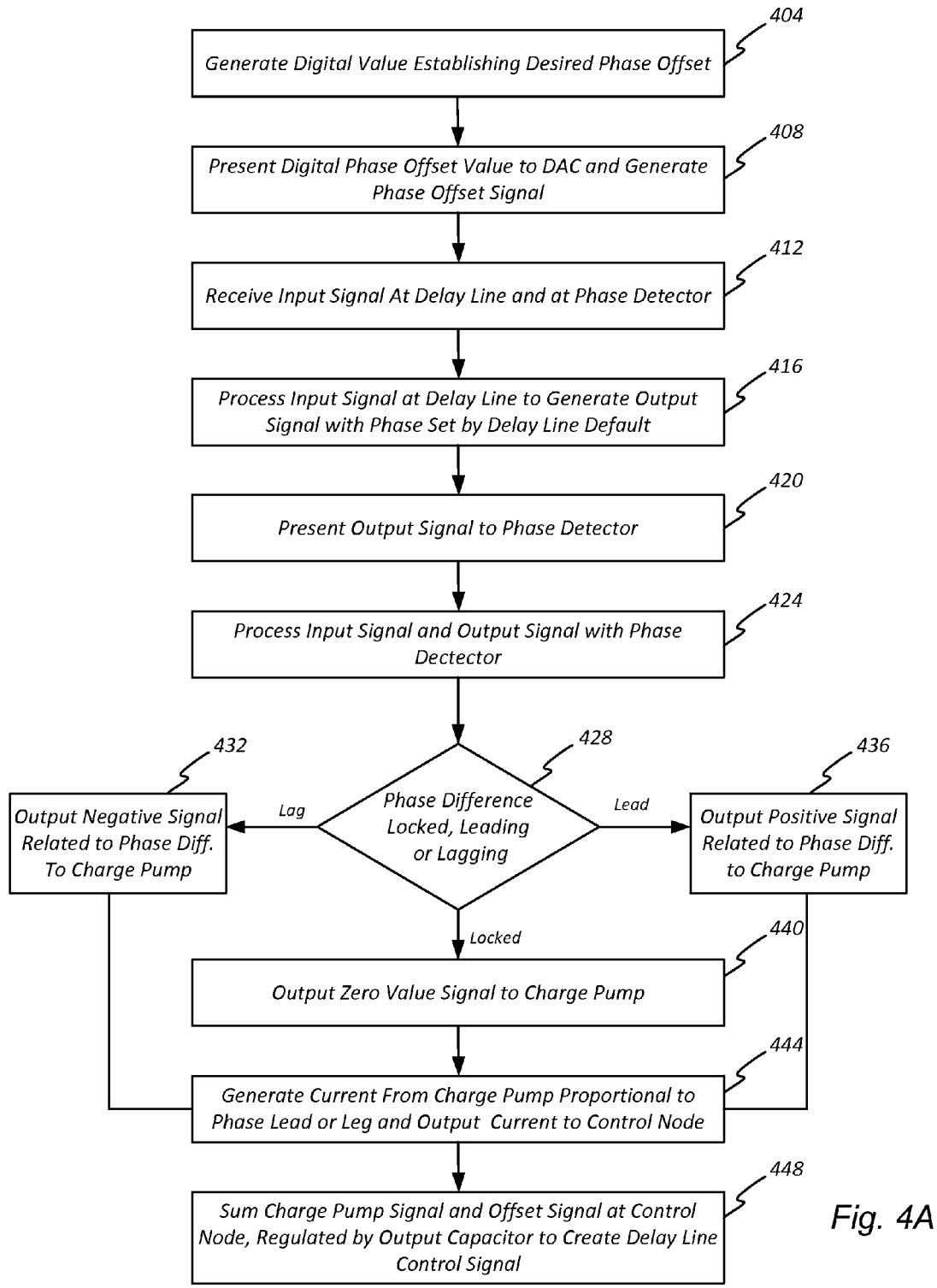
FIGS. 4A and 4B is an operational flow diagram of an exemplary method of generating a variable phase signal.
Figure 4B:
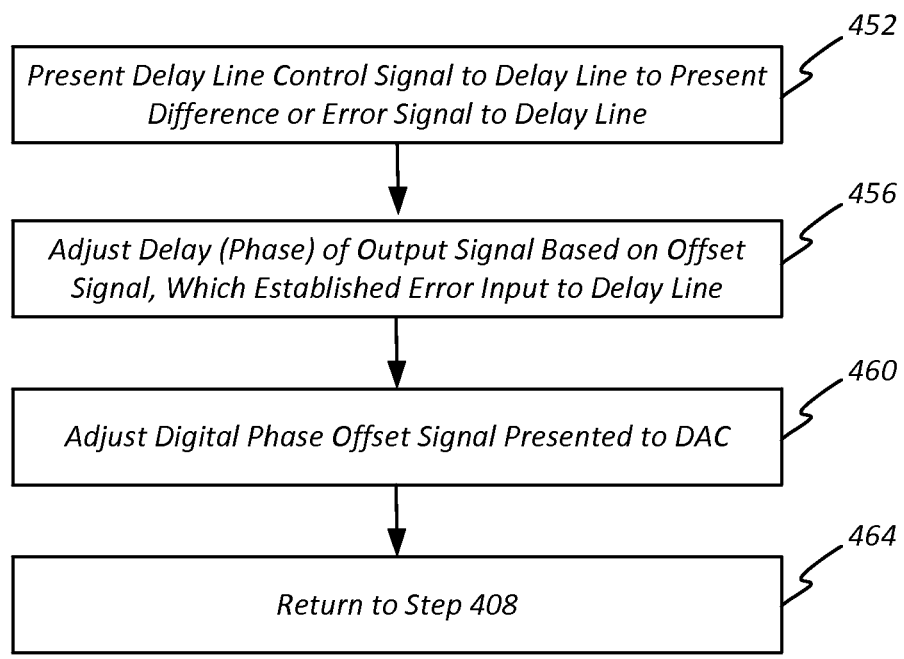

FIG. 4A is an operational flow diagram of an exemplary method of generating a variable phase signal. This is but one possible exemplary method of operation and as such it is contemplated that others may arrive at different method of operation. At a step 404 a controller generates a digital value establishing a desired phase offset. As discussed above, this may be provided by a user, from a processor, control logic, or other system. This digital value establishes the eventual phase offset of the output signal compared to the input signal.

At a step 408, a DAC receives the digital phase offset value and, in response, generates an analog phase offset signal. Thereafter or concurrently, at a step 412 the delay line receives an input signal, which may be a reference signal for which phase modification or a phase sweep is desired. The input may be provided from any source, such as but not limited to, a clock signal, or a local oscillator.

At step 416, the delay line processes the delay line input signal to generate a delay line output signal which, at this stage, defines the phase offset as established by the delay line. In this embodiment, absent an offset signal and over time, the output of the delay line will be established as one clock period delay as compared to the delay line input signal. In other embodiments, other default delay or phase offset values are established by the delay line such as but not limited to 0.5 clock period delay or any other delay value. As discussed above, the offset signal adjusts the phase offset of the delay line output signal as compared to the delay line input signal from this default value.

This output of the delay line is presented, at a step 420, to the phase detector. At step 424 the phase detector processes both the delay line input signal and the delay line output signal to determine the difference in phase, which may be referred to as the phase error, between the two signals.

Next, at decision step 428, based on the processing at step 420, it is determined whether the phase difference is locked, leading, or lagging. If the phase of the output signal is lagging the input signal, then the operation advances to step 432. At step 432 the phase detector outputs to the charge pump a negative signal that has a value related to or proportionate to the difference phase lag.

Alternatively, if at step 428 the phase of the output signal is leading the input signal, then the operation advances to step 436. At step 436, the phase detector outputs to the charge pump a positive signal that has a value related to or proportionate to the difference phase lead.

If the phase between the input signal and the output signal is locked, then the operation advances to step 440 and the phase detector outputs a signal having zero (or some other predetermined amount) to the charge pump. In other embodiment, the polarity of these signals may be inverted, or the output from the phase detector may be digital or a logic value, such as +1, −1, 0.

At a step 444, the charge pump, responsive to the phase detector output, outputs a value that is proportional to the phase lead or phase lag, based on the input from the phase detector. In one embodiment, the charge pump is configured as an integrator to thereby maintain a value at its output that represents the phase offset between the input signal and the output signal at the delay line. The output of the charge pump is provided to the control node and the signal on the control node is referred to as phase detector control signal.

At a step 448 the signals presented to the control node are summed or otherwise combined. In this example embodiment, the charge pump signal and the offset signal and summed at the control node. The output capacitor regulates the rate of change of the signal on the control node by maintaining charge at the node which limits the rate of change of the control node signal.

At a step 452, the control node signal is presented to the delay line as the delay line control input. The delay line control input determines the amount of delay, which may be equated to phase offset, that the delay line will impart to the output signal relative to the input signal. At a step 456, the delay, or phase offset, is established in the output signal by the delay line responsive to the delay line control signal on the control node. Typically, the delay line sets the delay of the output based on the control signal to be some fixed amount of delay, which is often one clock cycle of delay, through the operation of the phase detector and charge pump elements established by the feedback. In this embodiment, the addition or injection of the phase offset signal, forces the delay line to adjust the delay (phase) of the output, relative to the input signal. Thus, by adjusting the digital value presented to the DAC, the amount of delay in the output is proportionally adjusted, thereby establishing the output from the delay line as a phase offset from the input to the delay line.

At a step 460, the user or other system may adjust the digital phase offset presented to the DAC, which in turn is converted to an analog signal and added to the control node. The phase offset may be positive or negative. The phase offset adjusts the phase delay of the delay line output relative to the delay line input. In one embodiment, the digital offset signal is fixed, thereby resulting in a fixed phase offset at the delay line output. In another embodiment, the digital offset signal presented to the DAC is time varying and may be made to sweep over a range of phase delays, or assume different phase offsets at different time in a repeating pattern or random pattern.

At a step, 464, the operation returns to step 408 and as discussed earlier, the DAC converts the new offset signal to an analog value and presents that analog value to the control node.

Figure 5A:
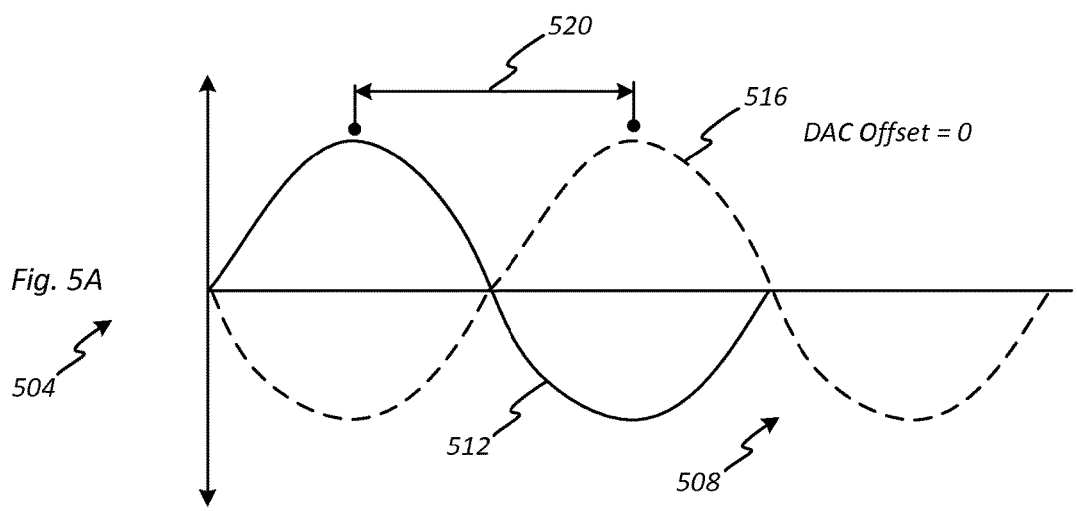
FIG. 5A illustrates exemplary plot of the delay line input signal and the delay line output signal.

FIG. 5A illustrates an exemplary plot of the delay line input signal and the delay line output signal corresponding in an exemplary delay line system. This is but one exemplary plot and other plots are possible using different system arrangements. In this example signal plot, signal magnitude is on the vertical axis 504 while time is represented on the horizontal axis 508. The delay line input is represented as plot 512 shown as a solid line while the delay line output is represented by plot 516 shown as a dashed line. In this plot, the phase offset signal from the DAC is set to zero and as a result, overtime, due to the phase detector and the charge pump operation, is set to have a phase offset 520 of one clock cycle delay. In other embodiments, the delay line could be configured to establish a different delay or phase offset between the input signal 516 and the output signal 516.

As part of these plots, the range of the digital input to the DAC, which acts as the offset signal, is established as an 8 bit signal, and thus the offset signal has 256 different possible values. This may be defined as having 256 levels of phase offset resolution. In other embodiment, the digital value may be represented by differing bit values, such as a 4 bit value (16 value resolution) or 16 bit value (64,000 value resolution).

Figure 5B:
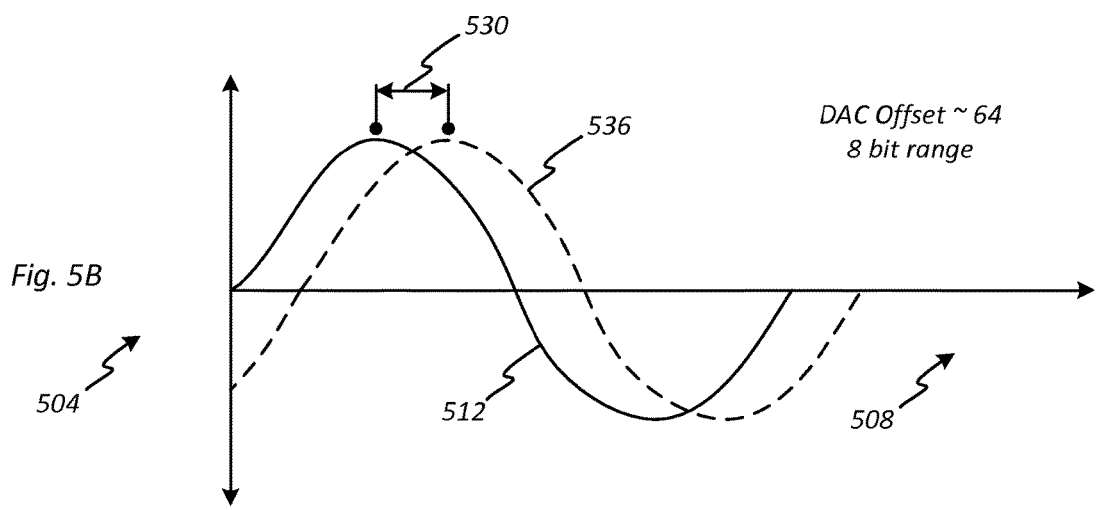
FIG. 5B illustrates exemplary plot of the delay line input signal and the delay line output signal corresponding in a first offset signal.

FIG. 5B illustrates an exemplary plot of the delay line input signal and the delay line output signal corresponding in an offset signal of 64 in a 8 bit digital offset signal (out of 256 total offset values). As compared to FIG. 5A, similar elements are identified with identical reference numbers. As shown, the phase of the output is shifted by a phase offset 530 corresponding to the value of the digital offset signal. This signal plot is not to scale, but the digital offset value of 64 provides about a ¼ clock period phase shift to the delay line output 536 as compared to the delay line input signal 512. The phase may be made to be leading or lagging in various embodiments. In this embodiment the phase of the output signal is leading the input signal.

Figure 5C:
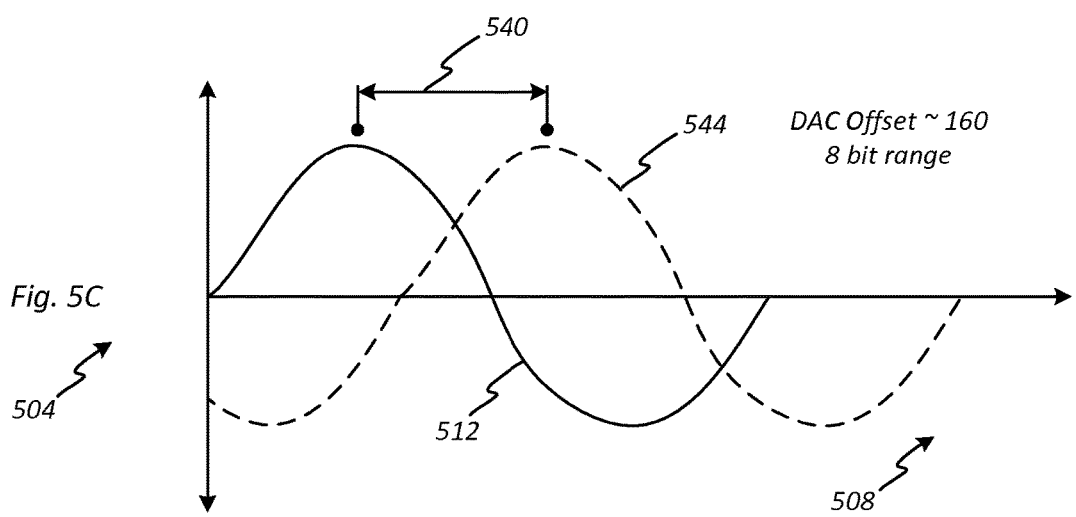
FIG. 5C illustrates exemplary plot of the delay line input signal and the delay line output signal corresponding in a second offset signal.

FIG. 5C illustrates an exemplary plot of the delay line input signal and the delay line output signal corresponding in an offset signal of about 160 in a 8 bit digital offset signal (out of 256 total offset values). As compared to FIG. 5A, similar elements are identified with identical reference numbers. As shown, the phase of the output signal 544 is shifted by a phase offset 540 corresponding to the value of the digital offset signal. This signal plot is not to scale, but the digital offset value of about 160 (out of a 256 possible values) provides about a 60% of one clock period phase shift. The phase may be made to be leading or lagging in various embodiments. In this embodiment, the phase of the output signal is leading the input signal.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A variable phase generator comprising:
   a delay line configured to:
      receive a delay line input signal at a delay line input;
      output a delay line output signal at a delay line output, the delay line output signal having a phase offset relative to the delay line input signal such that the phase offset is controlled by a digital offset signal;
   a delay line control input configured to receive a delay line control signal;
   a phase detector configured to receive and process the input signal and the output signal to generate a phase detector output signal representing a phase difference between the input signal and the output signal;
   a charge pump configured to receive the phase detector output signal and responsive to the phase detector output signal, generate and output a charge pump output;
   a digital to analog converter configured to:
      receive the digital offset signal such that the digital offset signal varies over time during operation to phase sweep over a range of phase offsets;
      convert the digital offset signal to an analog offset signal;
      output the analog offset signal; and
   a control node connected to the delay line control input, the charge pump, and the digital to analog converter, the control node configured to receive and combine the charge pump output and the analog offset signal to create the delay line control signal.

2. The phase generator of claim 1 further comprising an output capacitor connected to the control node, the output capacitor configured to limit a rate of change of the delay line control signal.

3. The phase generator of claim 1 wherein the delay line input signal is received from a local oscillator.

4. The phase generator of claim 1 wherein the phase detector comprises a comparator.

5. The phase generator of claim 1 wherein the phase detector is an analog signal that is proportional to the phase difference between the delay line input signal and the delay line output signal.

6. The phase generator of claim 1 wherein the charge pump outputs a current that has a polarity that indicates the phase of the delay line output signal as related to the delay line input signal.

7. A signal generator comprising:
   a variable phase generator configured to:
      receive an input signal, having an input signal phase, at an input port;
      output an output signal, having an output signal phase, at an output port, the output signal having a phase that is variable, responsive to a offset signal;
   a control input configured to receive a control signal, the control signal controlling the phase of the output signal relative to the input signal;
   an offset signal source comprising a memory configured to store the offset value;
   a user interface configured to control a phase offset controller to cause the phase offset controller to retrieve the offset value from the memory and provide the offset signal to a control node;
   the comparator configured to compare the input signal phase to the output signal phase to determine a phase difference, and responsive to the phase difference, generate and present an error signal to the variable phase generator to establish the output signal to a predetermined phase offset in relation to the input signal;
   the control node configured to:
      receive and combine the offset signal and the error signal from the comparator to create a feedback signal; and
      present the feedback signal to the variable phase generator, the feedback signal driving the phase difference between the input signal and the output signal to a combined phase offset that is controlled by the predetermined phase offset as established by the error signal and a phase offset established by the offset signal.

8. The signal generator of claim 7 wherein the variable phase generator comprises a delay line.

9. The signal generator of claim 7 wherein the comparator output and the offset signal are summed at the control node.

10. The signal generator of claim 7 wherein the error signal is configured to introduce one clock period delay to the output signal in relation to the input signal and the offset signal is configured to introduce an amount of delay into the output signal, in relation to the input signal, that is proportional to the offset signal.

11. The signal generator of claim 7 further comprising a digital to analog converter configured to receive and process a digital offset signal from memory to create the offset signal.

12. The signal generator of claim 7 wherein the offset signal is time varying.

13. A method for creating a variable phase output signal comprising:
- receiving a reference signal having a reference signal phase;
- responsive to an control signal on a control node, processing the reference signal with one or more delays to create a variable phase output signal having an output signal phase, the variable phase output signal having a phase offset from the reference signal that is variably determined by an offset signal, the offset signal continually varies over time during operation to phase sweep over a range of phase offsets;
- comparing the reference signal phase to the output signal phase to create an error signal indicating the phase difference between the reference signal and the variable phase output signal;
- responsive to the error signal, generating a feedback signal, the feedback signal provided to the control node;
- providing an offset signal to the control node, the offset signal defining the variable phase of the variable phase output signal;
- at the control node, combining the error signal with the offset signal to create the control signal.

14. The method of claim 13 wherein the feedback signal is created by a charge pump responsive to the error signal.

15. The method of claim 13 further comprising receiving a digital phase offset signal and converting the digital phase offset signal to the offset signal, the offset signal being an analog signal.

16. The method of claim 13 further comprising maintaining stability at the control node with a capacitor connected between the control node and a ground node.

17. The method of claim 13 wherein comparing the reference signal phase to the output signal phase is performed by a phase detector.

* * * * *